United States Patent
Sumnitsch

(10) Patent No.: US 6,383,331 B1
(45) Date of Patent: May 7, 2002

(54) DEVICE FOR DISCHARGING TWO OR MORE MEDIA WITH MEDIA NOZZLES

(75) Inventor: Franz Sumnitsch, Klagenfurt (AT)

(73) Assignee: SEZ Semiconductor-Equipment Zubehor fur die Halbeiterfertigung AG, Villach (AT)

( * ) Notice: Subject to any disclaimer, the term of this patent is extended or adjusted under 35 U.S.C. 154(b) by 0 days.

(21) Appl. No.: 09/542,337

(22) Filed: Apr. 5, 2000

(30) Foreign Application Priority Data

Apr. 6, 1999 (EP) .............................................. 99106780

(51) Int. Cl.[7] ................................................ B05B 3/00
(52) U.S. Cl. ...................... 156/345; 134/94.1; 134/95.3; 134/172; 134/179; 118/302; 118/315; 118/323
(58) Field of Search .......................... 156/345; 216/92; 118/302, 313, 315, 321, 323, 36; 134/94.1, 95.3, 199, 172, 179

(56) References Cited

U.S. PATENT DOCUMENTS 5,089,305 A 2/1992 Ushijima et al. ............ 118/302
5,997,653 A * 12/1999 Yamasaka ................... 134/95.3

FOREIGN PATENT DOCUMENTS

FR 2290177 * 11/1974

* cited by examiner

*Primary Examiner*—Thi Dang
(74) *Attorney, Agent, or Firm*—Young & Thompson

(57) ABSTRACT

The invention relates to a device (1) for discharging two or more media with media nozzles (15, 25, 35) in which each media nozzle is located on a media arm (10, 20, 30), with a suspension device for each media arm, so that the media arms can perform pivoting movements separately from one another around same axis (Z). Further, the invention relates to a unit for treating in each case a disk-shaped object (2) with at least two media, with a carrier for holding the disk-shaped object.

13 Claims, 2 Drawing Sheets

DEVICE FOR DISCHARGING TWO OR MORE MEDIA WITH MEDIA NOZZLES

Figure 1:
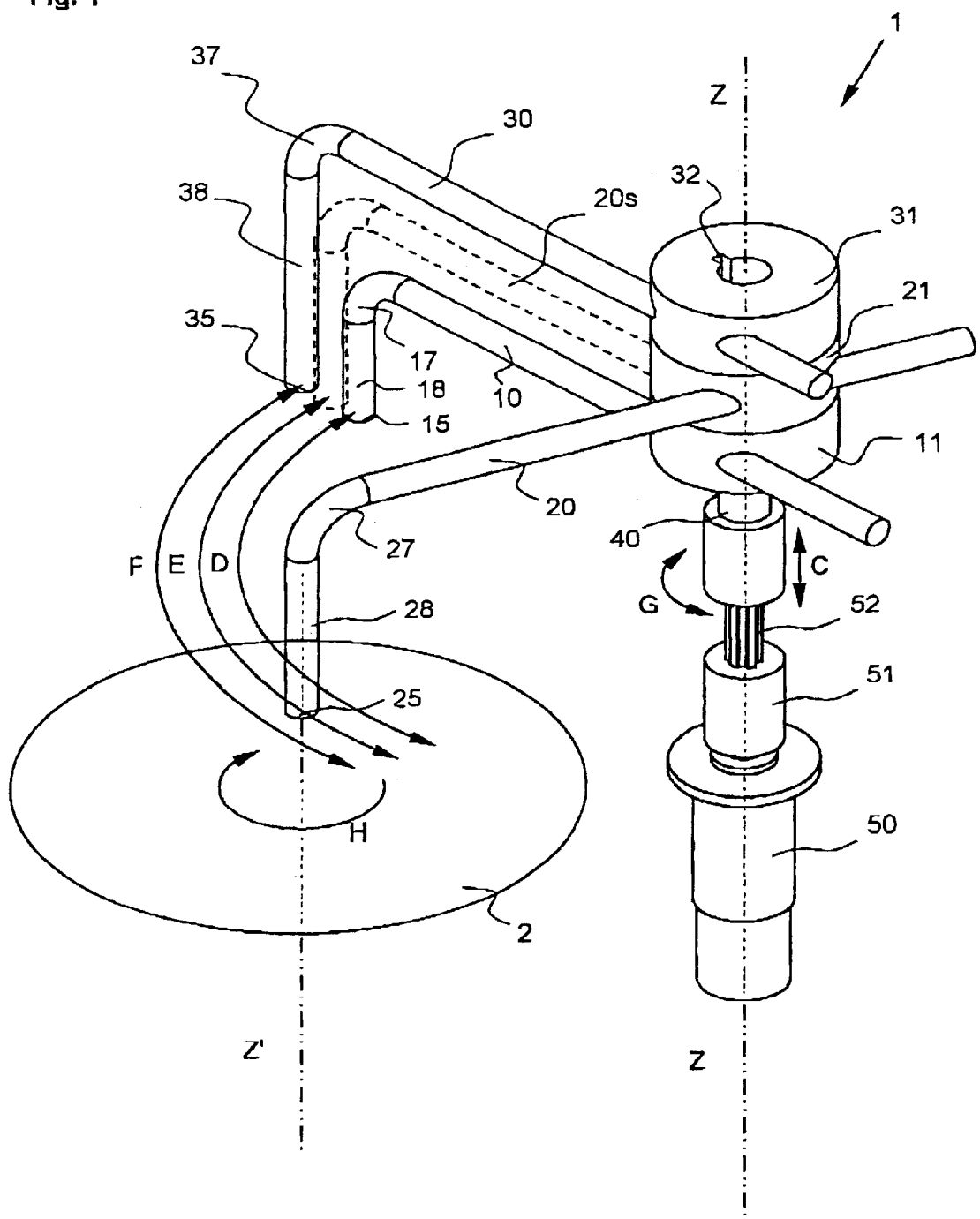

The invention relates to a device for discharging two or more media with media nozzles.

Such media nozzles are used, e.g., in treating disk-shaped objects such as semiconductor wafers (e.g., silicon wafers). They can also be used in treating flat screens (flat panel display) during their production. Specially shaped nozzles can be involved here, or simply the open mouth of a duct.

A media arm is understood as an essentially rigid arm that can be bent or straight. The duct that leads to the media nozzle can be either outside the media arm or, if the latter is, e.g., a pipe, be guided inside it.

The media that can be discharged through the media nozzles can be liquids, such as e.g., synthetic resin solutions (e.g., photoresist), cleaning agents, etching agents or solvents, but also gases, such as e.g., air or pure nitrogen. Such media are used in the treatment of semiconductor wafers. The treatment can be, e.g., a coating, etching, and/or cleaning. If gases are used, it is for drying. The vapor of an alcohol (e.g., isopropanol) can also be mixed into the gas.

Let pivoting be understood as a rotation movement in which the media arms make an angle with the rotation axis (pivot axis). The media nozzle mounted on the end of the media arm thus describes a circular path. The nozzle moves between a rest position and a working position, or, in a turned-on status (medium flowing), it moves back and forth between two reversible positions.

The invention further relates to a unit for treating one disk-shaped object in each case with at least two media and with a carrier to hold the disk-shaped object, in which such a device is used. The two media here are applied one after the other. The first medium can be a cleaning solution, the second a drying gas.

U.S. Pat. No. 5,089,305 describes various types of such devices with which two or more media can be applied, in particular on a rotating semiconductor wafer.

In one of the units described in U.S. Pat. No. 5,089,305, a media arm that has two nozzles is moved by a linear motor. The drawback of this unit is that when one medium is applied and a drop escapes from the nozzle of the other medium during the application, the former undesirably wets the surface of the semiconductor wafer. This can lead, in the worst case, to destruction of the wafer or of the structures located on it.

In another of the units described in U.S. Pat. No. 5,089,305, this problem is solved by having the media nozzles attached to separate media arms. The media arms are pivoted from the rest position into the working position. The drawback of this unit is that space and a separate drive mechanism must be made available for each media arm.

The third unit of U.S. Pat. No. 5,089,305 provides for a single media arm that can take various media nozzles from a rest position (standby position) and bring them separately from one another into a working position. The media arm can be moved by two linear motors or be made as an articulated arm. In both cases, the drive mechanism requires a lot of space and is very expensive. Further, for disruption-free operation, an extremely precise adjustment of the unit is necessary to take the media nozzles out of the rest positions, which entails additional expense.

Thus the object of the invention is to propose a device that can discharge several media in sequence from various nozzles, that solves the problem of dripping and moreover entails as small as possible an expense for mechanical or drive technology.

Consequently the invention proposes in its most general embodiment a device for discharging two or more media from media nozzles in which each media nozzle is located on one media arm each, and with a suspension device for each media arm, so that the media arms can perform pivot movements around the same axis, separately from one another.

A medium (gas or liquid) can be discharged from each media nozzle. A media arm is allocated to each media nozzle so that it can be assured that when the media nozzle is not operating (medium not flowing), it can be in a rest position.

By having one suspension device for each media arm, it is assured that the latter can be moved separately from one another. The suspension is to be done so that the pivot movement (rotation movement) of the media arms can be performed around a common rotation axis (pivot axis).

In this most general embodiment, each media arm can have its own drive unit (motor).

An essential advantage of the invention compared to the prior art is that the unneeded media nozzles can stay in a rest position and nevertheless stay mounted, fixed, on the media arm allocated to it in each case and thus the unit needs only a little space.

Since the media arms do not need to be removed from the operating area of the others after they are used, in one embodiment they are mounted to rotate freely on a common axis so as to perform the pivoting movement without getting in each other's way during the pivoting movement.

One embodiment provides for a drive unit for performing the pivoting movements that is subordinate jointly to all the media arms and for couplings to select the media arm(s) to be pivoted that are suitable for connecting the media arm(s) to be moved to the drive unit so that the torque of the drive unit is transmitted to the respective media arm.

If the drive starts operating, only that media arm is moved that connected by a coupling to the drive. Theoretically, two of, e.g., four media arms could be moved or pivoted simultaneously here.

The drive unit is usually a motor, i.e., a pressure medium motor (hydraulic motor) or an electric motor (e.g., a stepping motor). The drive can occur more or less directly or by a gear. The drive must be able to effect a back and forth movement.

The media arm is pivoted between a rest position and a working position or, in a turned-on status (medium flowing), it is moved back and forth between two reversible positions. The pivoting range can enclose an angle of 10° to 180°.

In one embodiment, the media arms are mounted on hubs that are on the same shaft. They have couplings that connect the shaft to one or more hubs to transmit the torque from the shaft to the hub.

In the rest position of the media arms, the hubs can rotate freely on the shaft and thus are not rotated along with the shaft when it rotates. If a hub is connected to the shaft by a coupling, then the hub rotates with it and the media arm mounted on it is correspondingly pivoted.

In another embodiment, the couplings consist of a key that is mounted on the shaft and at least one hub keyway per hub, in which the key can engage, and the key can be moved, by sliding the shaft in the axial direction, so that it can engage in the hub keyway of the hub whose media arm is to be moved.

In this case, since the key in each case can engage in the keyway of only one hub, only one hub is rotated by the shaft and thus only one media arm is driven. A change from one media arm to another can be performed only in the rest position, since otherwise the key cannot engage in the hub keyway. In the rest position, the key moves by lifting or lowering, i.e., sliding the shaft along its axis, and the key thus engages in the desired hub keyway and thus couples the drive unit by the shaft and hub to the media arm.

If the drive unit here is not also to be moved in the axial direction, then the shaft is attached to the rotating part of the drive so that, when the shaft moves in the axial direction, the drive doesn't move along with it.

This can be done, e.g., by a shaft in the form of a splined shaft (or serrated shaft) that is connected to a splined shaft hub (or hub with inner toothing) to be axially movable. If the splined shaft hub is driven by the drive unit, then the torque is transmitted to the splined shaft regardless of the axial position of the hub relative to the shaft.

Another embodiment is proposed in which the shaft is moved in the axial direction by a pneumatic device that can assume a number of positions corresponding to the number of media arms.

In contrast to the embodiment in which a shaft drives the hubs on which the media arms are located, in another embodiment the drive unit drives a driver and a coupling is allocated to each media arm and the coupling can engage in the driver.

The coupling can, if needed, connect the driver to the media arm that is mounted to rotate. In this embodiment, two or more of the media arms can also be moved simultaneously. The moved media arms remain parallel to one another if they are pivoted simultaneously.

In one embodiment, the driver is a strip located parallel to, and at a distance from, the axis on which the media arms are attached to rotate freely. The strip can perform a rotating movement around this axis. The coupling in this case can be a pin that engages in a hole allocated to it, or a fork that encloses the strip on both sides. The drive of such a coupling can be pneumatic or be performed by electromagnets.

Another part of the invention is a unit with at least one of the above-mentioned devices for treating at least one disk-shaped object in each case with a medium, and the unit has a carrier to hold the disk-shaped object.

Disk-shaped objects can be, e.g., semiconductor wafers (e.g., made of silicon). The media used for their treatment can be liquids such as, e.g., synthetic resin solutions (e.g., photo-resist), cleaning agents, etching agents or solvents, but can also gases such as air or pure nitrogen.

The carrier can be a vacuum carrier or also a carrier according to the Bernoulli principle.

In one embodiment of the unit, the outlet openings of the media nozzles are oriented essentially perpendicular to the flat surface of the carrier that is facing the disk-shaped object. "Essentially perpendicular" here is to include also a range of +/−45°. This orientation is especially important when a liquid is discharged from the media nozzle in a laminar stream and at low pressure.

Another embodiment provides for the unit to contain means to make the carrier (and, with it, the disk-shaped objects on it) rotate.

If liquid is applied to the surface of the object, it is thrown off its edge.

In one embodiment, the rotation axis of the carrier is essentially parallel to the pivot axis of the carrier.

Figure 2:
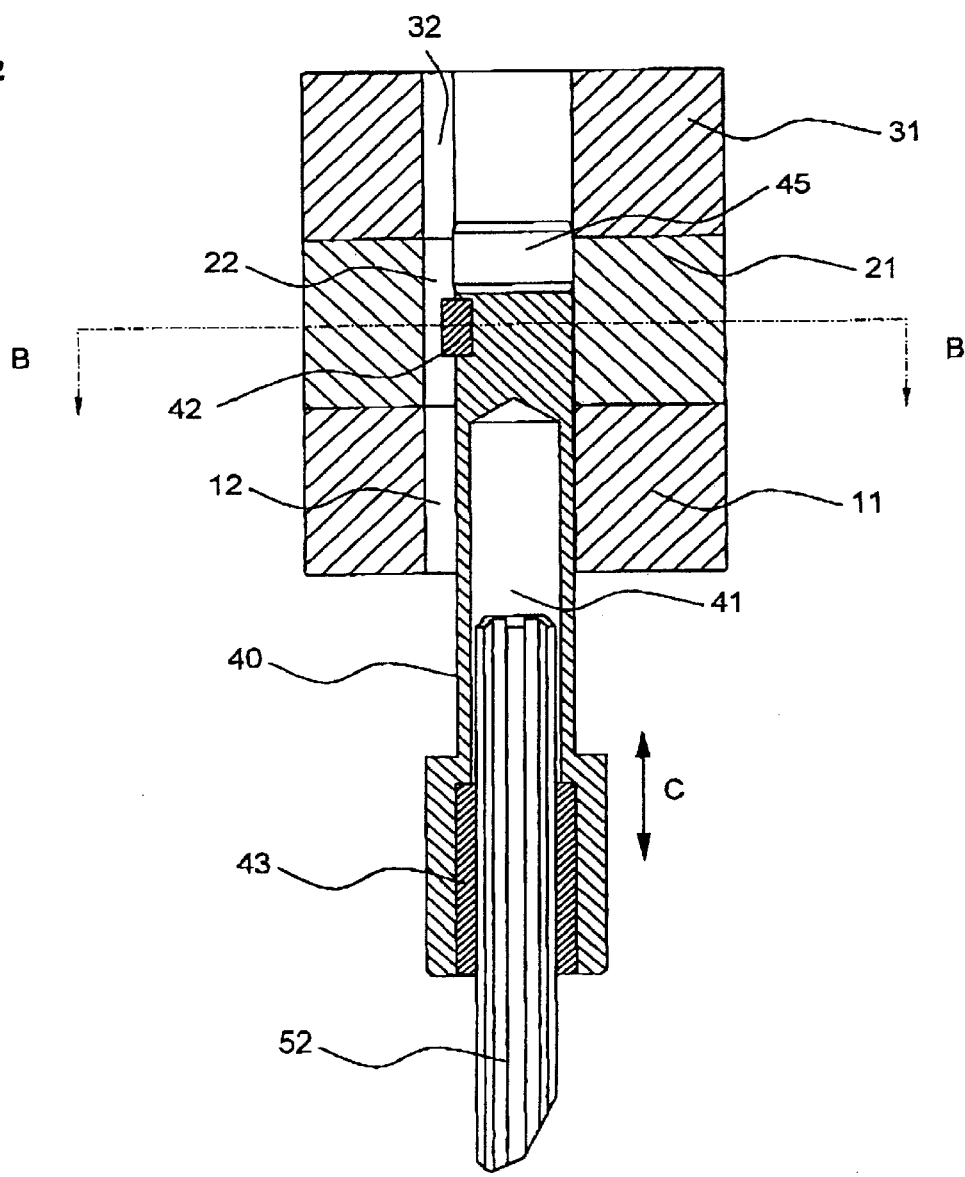
Figure 3:
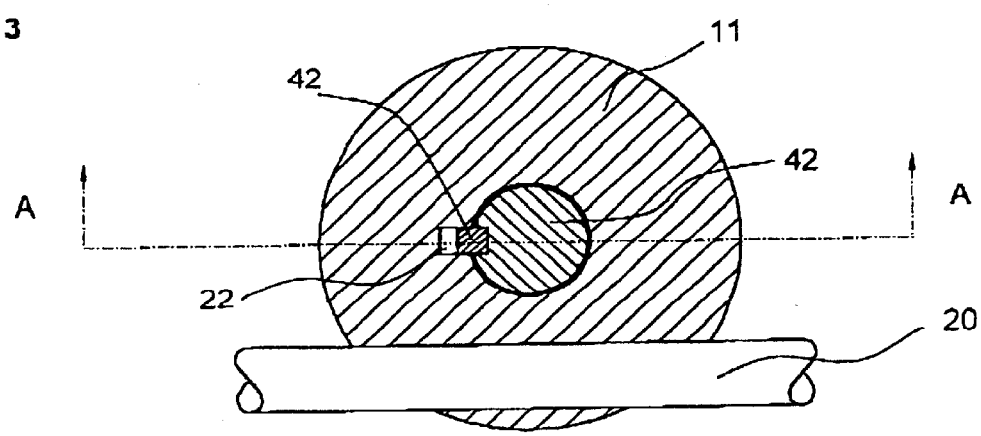

Other details, features, and advantages of the invention come out from the following description of the embodiment of the invention shown in the drawings. FIG. 1 shows a diagrammatic oblique view of an embodiment 1 according to the invention with three media arms 10, 20, and 30. FIG. 2 shows a lengthwise section (A—A in FIG. 3) and FIG. 3 shows a cross section (B—B in FIG. 2) of a part of the mechanism of this embodiment.

2 designates the disk-shaped object on which the media that are to be discharged from the nozzles of the media arms are applied. Arrow H shows the rotation movement of the wafer around its axis Z' during the treatment. Rotation axis Z' is parallel to pivot axis Z around which the media arms are pivoted.

Media arms 10, 20, and 30 are mounted on hubs 11, 21, and 31 essentially perpendicular to, but at a distance from, vertical axis Z around which they can be pivoted. In other words, the media arms are placed horizontally. Media arms 10 and 30 are in rest position (stand-by position) in FIG. 1. Rest position 20s of middle medium arm 20 is shown in dashed lines. In the rest position, the three media arms lie parallel to one another.

Each of the three media arms 10, 20, and 30 is made as a pipe. The medium to be supplied can be guided either directly in this pipe or in a duct that has been inserted into the pipe. The media arms are bent downward by 90° on their discharge sides by knees (17, 27, 37). Thus nozzles (15, 25, 35) point vertically downward. The medium exiting the nozzles thus strikes the surface of disk 2 to be treated perpendicularly.

To be able to guarantee for all three media arms that the distance from nozzles (15, 25, 35) to disk 2 is the same, end parts 18, 28 or 38 of each media arm—the vertical part between knee and nozzle—must have different lengths. Accordingly, end part 18 of lower media arm 10 is shorter than end part 28 of the middle one and it, in turn, is shorter than end part 38 of the upper one.

So that the media arms do not impede one another during their pivoting movements, the knees are at corresponding distances from pivot axis Z, i.e., knee 17 of the lower media arm is closer to axis Z and knee 37 of the upper media arm is further away from the axis than knee 25 of the middle media arm.

Since the nozzles are located in the same plane perpendicular to pivot axis Z and at varying distance to this axis Z, they are guided along arcs of concentric circles, represented by arrows D, E, and F, when the media arms are pivoted.

When it is necessary for the media to strike the wafer at the same point (e.g., wafer center), then the nozzles must be accordingly oriented. This can be done by having knee 17 of the lower media arm bent less than 90° (e.g., 80°) and knee 37 of the upper media arm more than 90° (e.g., 100°) (not shown).

Hubs 11, 21 and 31 on which the media arms are mounted are located one above the other and have the same axis Z. Shaft 40, which can move axially, is located in the hubs. The movement is shown by arrow C.

The hubs are contained in a common housing (not shown) by externally attached bearings (not shown). The housing has suitable openings so as not to impede the media arms in their movement.

Each hub 11, 21 or 31 has a hub keyway 12, 22 or 32 on the inside. If the media arms are in rest position, the hub keyways are aligned.

A key 42 is mounted on shaft 40, i.e., the key is pressed into a shaft keyway. Key 42 can engage in any of hub keyways 12, 22, and 32; it is used for transmitting torque from the shaft to the desired hub. Key 42 is moved by axial movement C of shaft 40. This can occur by a pneumatic cylinder with three positions (not shown). So as not to have shaft 40 come into contact with the inside of the hub during movement in direction C, a guide element 45 (not cross sectioned in FIG. 2) is attached to its upper end.

Since hub keyways 12, 22, and 32 are aligned only in the rest position of all media arms, it is possible for shaft 40 (and key 42 with it) to move only in this position.

In FIG. 2 and FIG. 3, key 42 engages in hub keyway 22 of middle hub 21 (only the rest position is shown here). If shaft 40 is rotated by an angle (arrow G in FIG. 1), then middle media arm 20 is pivoted by the same angle (arrow E), as shown in FIG. 1. The working position can be fixed, or the media arm is moved back and forth between two reversible points while medium is discharged.

Shaft 40 is driven through a splined shaft 52 by a splined shaft hub 43 pressed into it. Splined shaft 52 is connected to motor 50 by connecting part 51. Shaft 40 is hollow in area 41 to give splined shaft 52 room in it when it moves. When shaft 40 moves axially, the position of splined shaft 52 relative to hubs 11, 21, and 31 does not change. Thus it is possible to mount the housing (not shown) containing the hubs, and motor 50, on elements that are rigidly connected to one another (e.g., common carrier plates).

What is claimed is:

1. Device for discharging two or more media from media nozzles in which each media nozzle is located on one media arm each, with a suspension device for each media arm, so that the media arms can perform pivoting movements around the same axis separately from one another.

2. Device according to claim 1, in which the media arms are attached, to perform the pivoting movement, to rotate freely on a common axis in a way such that they do not impede one another when performing the pivoting movement.

3. Device according to claim 2 with a drive unit allocated to all media arms jointly, to perform the pivoting movements, and couplings to select the media arm(s) to be pivoted and suitable for connecting the media arm(s) to be moved to the drive unit so that the torque of the drive unit is transmitted to the media arm.

4. Device according to claim 3, wherein the media arms are mounted on hubs located on the same shaft and wherein couplings connect the shaft to one or more hubs to transmit the torque from the shaft to the hub.

5. Device according to claim 4, in which the couplings consist of a key (42), which is fitted to the shaft and the least one keyway (12, 22, 32) per hub, with which the key can engage, and the key can be moved, by moving the shaft in the axial direction (C), so that it can engage in the hub keyway of the hub whose media arm is to be moved.

6. Device according to claim 5, wherein the shaft is attached to the rotating part of the drive so that when the shaft moves in the axial direction the drive is not moved along with it.

7. Device according to claim 5, wherein the shaft is moved in the axial direction by a pneumatic device that can assume a number of positions corresponding to the number of media arms.

8. Device according to claim 3, wherein the drive unit drives a driver and a coupling is allocated to each media arm and the coupling can engage with the driver.

9. Device according to claim 8, wherein the driver is a strip located parallel to, and at a distance from, the axis on which the media arms are attached to rotate freely, and this strip can perform a rotation movement around this axis.

10. Unit with a device according to claim 1 for treating in each case a disk-shaped object with a medium, with a carrier to hold the disk-shaped object.

11. Unit according to claim 10, and the outlet openings of the media nozzles are oriented essentially perpendicular to the flat surface of the carrier that faces the disk-shaped object.

12. Unit according to claim 10 with means to make the carrier rotate.

13. Unit according to claim 12, wherein the rotation axis of the carrier is essentially parallel to the pivot axis of the media arms.

* * * * *